United States Patent [19]

Kato

[11] 4,354,163
[45] Oct. 12, 1982

[54] HIGH VOLTAGE BUFFER AMPLIFIER

[75] Inventor: David S. Kato, Fountain Valley, Calif.

[73] Assignee: Ford Aerospace & Communications Corporation, Detroit, Mich.

[21] Appl. No.: 145,109

[22] Filed: Apr. 30, 1980

[51] Int. Cl.$^3$ .......................... H03F 1/34; H03F 3/68
[52] U.S. Cl. .................................. 330/293; 330/311; 330/108
[58] Field of Search ............... 330/108, 260, 293, 297, 330/311

[56] References Cited

U.S. PATENT DOCUMENTS

| | | |
|---|---|---|
| 3,246,252 | 4/1966 | Beyer . |
| 3,457,520 | 7/1969 | Townsend . |
| 3,534,283 | 10/1970 | Seidel . |
| 3,573,646 | 4/1971 | De Wit . |
| 3,668,539 | 6/1972 | Healey . |
| 3,983,503 | 9/1976 | Bannister et al. |
| 4,048,575 | 9/1977 | Musa . |
| 4,097,824 | 6/1978 | Ishizuka et al. .................. 330/260 |
| 4,103,248 | 7/1978 | Idei . |
| 4,183,020 | 1/1980 | Schade, Jr. |

OTHER PUBLICATIONS

Shea, Richard, Amplifier Handbook 1966, pp. 17-74, FIG. 91.

Primary Examiner—James B. Mullins
Assistant Examiner—Gene Wan
Attorney, Agent, or Firm—Edward J. Radlo; Robert D. Sanborn

[57] ABSTRACT

A buffer amplifier is disclosed which has the ability to retain a high voltage from input to output and is capable of coupling to highly capacitive loads. The input impedance can be tailored up to several hundred thousand ohms. The frequency range is from 0.5 Hz to 6 KHz for highly capacitive loads. The amplifier comprises, in combination, an input impedance matching stage and a first and a second amplification stage. The input impedance matching stage consists solely of passive components. The first amplification stage comprises an operational amplifier in series with a high voltage transistor. Circuitry associated with the transistor provides separate controllable AC and DC gains. The AC gain is fed back through a feedback loop to the op amp and does not contribute much to the overall AC gain of the stage, which is determined by two resistors. The DC gain is separately established and is used to set the proper biasing for the second amplification stage, which comprises a high voltage transistor connected in emitter follower configuration. The second amplification stage provides isolation and the capability of driving into highly capacitive loads.

12 Claims, 1 Drawing Figure

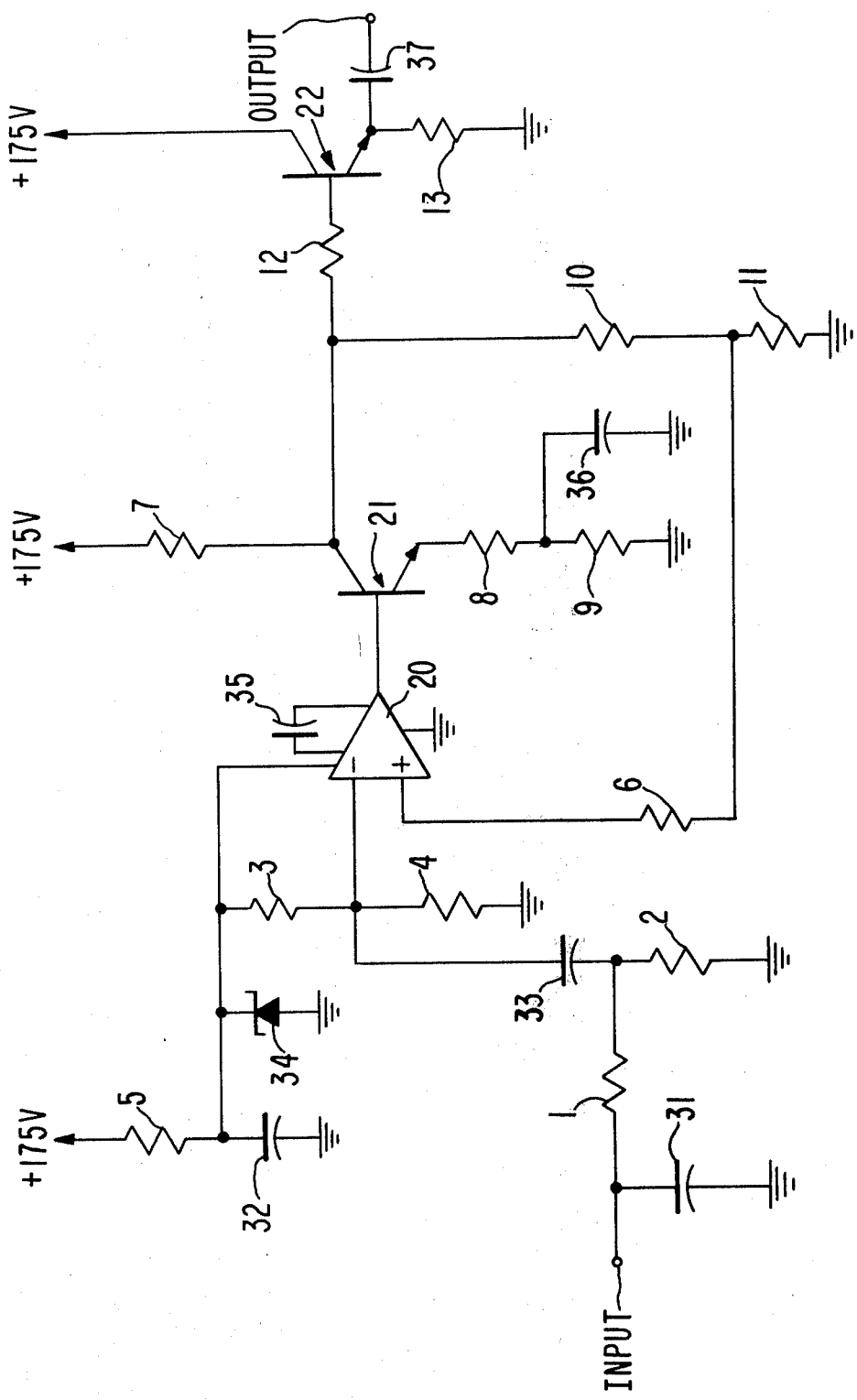

HIGH VOLTAGE BUFFER AMPLIFIER

The U.S. Government has a paid-up license on this invention and the right in limited circumstances to require the patent owner to license others on reasonable terms as provided for by the terms of Contract No. F08635-78-C-0088 awarded by the U.S. Air Force.

BACKGROUND OF THE INVENTION

1. Field of the Invention:

This invention is a buffer amplifier capable of retaining a high voltage from input to output and capable of coupling to highly capacitive loads. The input impedance can be tailored up to a hundred thousand ohms via component value selection. The frequency range is 0.5 Hz to 6 KHz for highly capacitive loads.

2. Description of the Prior Art:

A patentability search was conducted which disclosed the following U.S. Pat. Nos. 3,246,252; 3,457,520; 3,534,283; 3,573,646; 3,668,539; 3,983,503; 4,048,575; 4,103,248; and 4,183,020.

The present amplifier offers the following advantages over the prior art;

It is capable of driving highly capacitive loads over a wide frequency range. Most high voltage amplifiers presently available are not capable of driving large capacitive loads.

The high input impedance of the first amplification stage allows the placement of relatively large matching or loading impedances precisely.

The amplifier can handle high input voltages from vacuum tube circuits directly without the use of vacuum tubes of its own.

Most commercially available high voltage amplifiers require plus and minus high voltage power supplies for power. On the other hand, this amplifier requires only a single power supply.

The gain of the amplifier is easily adjusted because the gain is determined solely by four resistors, which can be potentiometers.

The impedance of the input load is easily verified due to the passive nature of the input impedance matching circuit, which is capable of matching a wide range of input impedances.

The components utilized are inexpensive and few in number.

SUMMARY OF THE INVENTION

The present invention is a buffer amplifier which preserves a high voltage from input ot output, can couple to a highly capacitive load, and can couple to a high input impedance. The frequency range of the amplifier is 0.5 Hz to 6 KHz with a highly capacitive load.

The amplifier comprises an input impedance matching stage, followed by first and second amplification stages. The input impedance matching stage consists solely of passive components and is connected to the first amplification stage via an AC coupling capacitor. The (negative) gain of the input impedance matching stage is set solely by means of two resistors.

The first amplification stage comprises an operational amplifier in series with a high voltage transistor. Circuitry associated with this transistor (7, 8, and 9) provides separate controllable AC and DC gains. The AC gain is fed back through a feedback loop to the operational amplifier. The DC gain is separately established and is used to set the biasing for the second amplification stage. The overall AC gain of this stage is dominated solely by two resistors (10 and 11).

The second amplification stage comprises a high voltage transistor connected in an emitter follower configuration. This stage provides isolation and the capability of driving into a highly capacitive load.

BRIEF DESCRIPTION OF THE DRAWING

These and other more detailed and specific objects and features of the present invention are more fully disclosed in the following specification, reference being had to the accompanying drawing, in which:

FIG. 1 is a circuit diagram of a preferred mode of operation of the present invention.

DESCRIPTION OF THE PREFERRED EMBODIMENT

Applied to the INPUT terminal is a high voltage AC signal. The voltage range of this input signal is limited by the output voltage capability. The output voltage in turn is limited to one half the value of the power supply voltage, which in this case is 175 volts. Thus, for the embodiment shown in FIG. 1, the input voltage and the output voltage can be 0 volts to $87\frac{1}{2}$ volts peak. Higher voltages are possible if transistors 21 and 22 are replaced by components having a higher voltage handling capability. The frequency range of the input signal is 0.5 Hz to 6 KHz with a highly capacitive output load.

The input impedance of the circuit illustrated in FIG. 1 is the impedance of the parallel circuit comprising capacitor 31 plus the series combination of resistor 1 and resistor 2. With this circuit it is feasible to match impedances up to hundreds of thousands of ohms, because the input impedance of the first amplification stage is very high. In the exemplary preferred embodiment, resistor 1 is 86.6K ohms, resistor 2 is 14K ohms, and the input impedance of the first amplification stage is approximately 3.4 M ohms. Note that all the components of the input impedance matching circuit are passive components. Thus, it is easy to verify the input impedance of the system.

Resistors 1 and 2 determine the (negative) gain of the input impedance matching stage and thus have a bearing on the overall AC gain of the amplifier.

Resistors 1 and 2 as well as resistors 10 and 11 should be high quality resistors with a maximum resistance deviation of one percent. For example, these resistors can be metal film RNC55 type resistors. The other resistors should be accurate to within plus or minus five percent and can be carbon resistors.

The input signal is applied through capacitor 31 to ground; and through resistor 1 to one end of resistor 2, the other end of which is connected ground, and to one end of capacitor 33, the other end of which is connected to the inverting (minus) input terminal of operational amplifier 20. Resistor 4 is connected between the inverting input terminal of op amp 20 and ground. Resistor 3 is connected between the inverting terminal of op amp 20 and a first power supply terminal of op amp 20. This first power supply terminal is also connected: (1) via resistor 5 to the common power supply voltage, which in the exemplary preferred embodiment is +175 volts DC; (2) via capacitor 32 to ground; and (3) via Zener diode 34 to ground.

Capacitor 35 is connected between the two compensation inputs of op amp 20. The second power supply terminal of op amp 20 is connected to ground.

The output of op amp 20 is connected to the base of NPN transistor 21. The collector of transistor 21 is connected via resistor 7 to the common power supply, which in the exemplary preferred embodiment is +175 volts DC. The collector of transistor 21 is also connected via resistor 12 to the base of NPN transistor 22. The collector of transistor 21 is also connected via resistor 10 and resistor 11 to ground. Resistor 6 is connected between the positive input terminal of op amp 20 and the common connection point of resistors 10 and 11. The emitter of transistor 21 is connected via resistor 8 and resistor 9 to ground. Capacitor 36 is connected between ground and the common connection point of resistors 8 and 9.

The collector of transistor 22 is connected to the common power supply, which in the exemplary preferred embodiment is +175 volts DC. The emitter of transistor 22 is connected via resistor 13 to ground and via capacitor 37 to the OUTPUT terminal.

Capacitor 33 is an AC coupling capacitor whose function is to block the flow of direct current into the amplification stages and to remove resistors 1 and 2 from the bias of op amp 20. In the preferred embodiment illustrated in FIG. 1, capacitor 33 has a value of 0.1 microfarads.

Resistor 5, capacitor 32 and Zener diode 34 comprise a power supply voltage reduction circuit which drops the common power supply voltage down to a level sufficient to enable op amp 20 to perform, in this case 24 volts DC. In the embodiment illustrated, resistor 5 is a 10K ohm 5 watt resistor, capacitor 32 is a 1 microfarad capacitor, and Zener diode 34 is of the type 1N4749 and acts as a voltage regulator.

Resistors 3 and 4 constitute a voltage divider and serve to set the bias voltage for op amp 20. The bias voltage is determined by resistors 3 and 4 to be one half of the power supply voltage on op amp 20. In the preferred embodiment illustrated, resistors 3 and 4 each have a value of 6.8 M ohms.

Op amp 20 is a MOSFET input device which can be a CA3140T, operated from a single power supply voltage of 24 volts DC. A MOSFET was chosen for this component because of its high input impedance. This high Z enables resistors 3 and 4 to be high, and therefore, they do not play a role in determining the gain of the first amplification stage of the present circuit.

The active components in the first amplification stage are op amp 20 and NPN transistor 21. The purpose of this stage is to provide an optimized signal handling capability, i.e., optimum voltage handling capability with minimal distortion; to enable the AC gain of the stage to be selected solely via the adjustment of two resistors; and to provide a separate and controllable DC gain for proper biasing of the second amplification stage.

The output of op amp 20 is 0 volts to 24 volts; 12 volts with no signal present at its negative input.

Capacitor 35 is connected between the compensation inputs of op amp 20 (pins 1 and 8 for the CA3140T MOSFET) and is a 1500 picofarad capacitor whose function is to stabilize the frequency response of device 20. The compensation inputs of op amp 20 shape the frequency characteristic of the device.

Transistor 21 is a high voltage transistor. It is connected in common emitter configuration and can be a 2N3439. In conjunction with resistors 7, 8, and 9, and capacitor 36, transistor 21 provides the high voltage output capability of the second stage. It provides the needed DC amplification for the biasing of transistor 22 and a separate and controllable AC gain for the feedback loop through resistors 10, 11, and 6 to op amp 20. The AC gain associated with transistor 21 is R7/R8 (as used throughout this specification, Rn is the resistance of resistor n for any integral value of n). This gain is used as part of the gain of the feedback loop back into op amp 20. The higher the value of R7/R8, the less significant these resistors become in determining the overall AC gain of the second amplification stage.

The DC gain associated with transistor 21 is R7/(R8+R9). This DC gain is used to set the proper bias for transistor 22 (approximately 87½ volts). R9 can be varied to adjust this biasing without affecting any AC gain. By providing an AC short, capacitor 36 gives the capability of separating the AC and DC gains.

For the preferred embodiment shown, resistor 7 is a 15K ohm 1 watt resistor, resistor 8 is 100 ohms, resistor 9 is 2.2K ohms, and capacitor 34 is a 47 microfarad 35 volt electrolytic capacitor.

Resistors 10 and 11 are used to set the overall gain of the first amplification stage. In the preferred embodiment illustrated, resistor 10 has a value of 86.6K ohms, and resistor 11 has a value of 14K ohms.

In the preferred embodiment, resistor 6 has a value of 22K ohms. Its purpose is to protect op amp 20 from voltage transients. The voltage drop across resistor 6 is negligible because the impedance at the noninverting input terminal of op amp 20 is high; therefore, the resistance of resistor 6 is not a significant part of the gain for this stage.

Transistor 22 is a high voltage transistor, e.g., a 2N3439 device, with a bias level of 87½ volts, and is the heart of the second amplification stage. The purpose of this stage is to provide isolation and the capability of driving into a high capacitive load (up to 7000 picofarads). This stage does not provide a gain. Resistors 12 and 13 and high voltage transistor 22 together form an emitter follower to provide the required buffering.

Resistor 12 has a value of 2.2K ohms in the preferred embodiment illustrated, and helps to isolate the capacitive load by increasing the impedance of the second amplification stage, i.e., the impedance seen by the first amplification stage. Transistor 22 is connected in a common collector configuration (the power supply connection to the collector of transistor 22 serves as an AC ground).

In the preferred embodiment illustrated in FIG. 1, the value of resistor 13 is 15K ohms. A 1 watt resistor, its function is to bias the current for transistor 22 so that the power dissipation of transistor 22 stays within its limits.

In the preferred embodiment illustrated, capacitor 37 is a 1 microfarad 200 volt capacitor. It is an AC coupling capacitor and removes DC biasing from the output.

The following AC signal analysis will illustrate the effects of the various components on the AC gain of the amplifier. As indicated above, the effect of resistors 3, 4, 6, and 9 can be ignored for purposes of examining the AC gain of the second amplification section, and we need look only at op amp 20, transistor 21, and resistors 7, 8, 10, and 11. Let A be the amplification provided between the inputs of op amp 20 and the collector of transistor 21. Then:

$$(E_{neg} - E_{pos})A = E_{out} \tag{1}$$

where Eneg is the voltage applied at the negative (inverting) terminal of op amp 20, Epos is the voltage applied at the positive (noninverting terminal of op amp 20, and Eout is the voltage at the collector of transistor 21.

Because of the action of the voltage divider consisting of resistors 10 and 11, it follows that:

$$E_{pos} = \frac{E_{out} \cdot R11}{R10 + R11} \tag{2}$$

Substituting eqn. (2) into eqn. (1):

$$\left[ E_{neg} - \frac{E_{out} \cdot R11}{R10 + R11} \right] A = E_{out} \tag{3}$$

Rearranging:

$$\frac{E_{out}}{E_{neg}} = \frac{1}{\frac{1}{A} + \frac{R11}{R10 + R11}} \tag{4}$$

Thus, as A gets very large, Eout/Eneg, which is the gain of the first amplification stage, approaches as a limit (R10+R11)/R11. This is a desirable state of affairs because then the amplification caused by the first amplification stage is governed solely by two resistors, which can be made potentiometers for ease of variation. Thus, it is desirable to make A very large. Now:

$$A = -B \left( \frac{-R7}{R8} \right) = \frac{B \cdot R7}{R8} \tag{5}$$

where B is the amplification of op amp 20 and R7/R8 is the AC amplification associated with transistor 21. There are two ways to attain the desired high value of A. The first is to choose an op amp with a high value of B. The second is to select resistors that will provide a high value of R7/R8. The latter goal can be accomplished even when the DC gain associated with transistor 21 (R7/(R8+R9)) must be less than 1. For a fixed B, the higher R7/R8 is, the higher will be A; and thus, the lower will be the impact of R7/R8 on the gain of the first amplification stage. For a high A, the gain of this stage is dominated by R10 and R11.

The gain of the input impedance matching stage is R2/(R1+R2) when R1 and R2 are much less than R3 and R4. Note that this gain is less than one. The overall gain of this amplifier is the gain of the input impedance matching stage times the gain of the first amplification stage, since the gain of the second amplification stage is 1. Thus, for the design considerations described above, the overall gain of the amplifier approximates $$\left( \frac{R2}{R1 + R2} \right) \left( \frac{R10 + R11}{R11} \right).$$

Note that if R2=R11 and R1=R10 as illustrated in FIG. 1, it follows that the gain of the overall amplifier circuit is approximately 1.

The above description is included to illustrate the operation of the preferred embodiments, and is not meant to limit the scope of the invention. The scope the invention is to be limited only by the following claims. From the above discussion, many variations will be apparent to one skilled in the art that would yet be encompassed by the spirit and scope of the invention.

What is claimed is:

1. An amplifier circuit comprising, in combination:
   an input impedance matching stage isolated from remaining portions of said circuit;
   a first amplification stage connected to said impedance matching stage, comprising, in series, an operational amplifier and a transistor;
   a feedback loop connected between an output of said transistor and an input of said operational amplifier, said feedback loop consisting solely of resistive components; and
   a second amplification stage connected to said first amplification stage, said second stage comprising an emitter follower transistor network, wherein said second stage is isolated from said operational amplifier.

2. The circuit of claim 1 wherein said operational amplifier and said two transistors are supplied from a single DC power supply.

3. The circuit of claim 1 wherein the impedance matching stage consists solely of passive components, and the input impedance of the first amplification stage is much greater than the impedance of the impedance matching stage.

4. The circuit of claim 1 further comprising an isolation resistance having a fixed value connected between said first amplification stage and said second amplification stage, and a capacitor connected between the transistor of the second amplification stage and an output terminal of said amplifier circuit, wherein said isolation resistance does not affect the frequency response of the circuit.

5. The circuit of claim 1 wherein the transistor of the first amplification stage provides different amounts of DC and AC gain.

6. The circuit of claim 5 wherein the DC and AC gains are adjustable independently of each other.

7. The circuit of claim 6 wherein said DC gainis used to provide the bias to the transistor of the second amplification stage.

8. The circuit of claim 7 wherein said feedback loop comprises a first resistor having a first terminal connected to the transistor of the first amplification stage, a second resistor connected between a second terminal of said first resistor and ground, and a third resistor connected between said second terminal of said first resistor and an input terminal of said operational amplifier.

9. The circuit of claim 8 wherein the gain of said first amplification stage is substantially determined by the value of said first and said second resistors.

10. An amplifier circuit for processing an input signal comprising:
    An operational amplifier having two inputs and an output;
    a transistor having only one base, a collector, and an emitter, said base connected to the output of said operational amplifier, said transistor having an AC gain circuit and a DC gain circuit adjustable independently of said AC gain circuit; and
    a feedback loop connecting the collector of said transistor to one input of said operational amplifier;

wherein the input signal is applied to the other input of said operational amplifier;

wherein said feedback loop does not affect the gain of said operational amplifier;

wherein said feedback loop comprises a pair of voltage dividing resistances R1 and R2 and an overvoltage protection resistance, wherein the overall AC gain of said amplifier circuit is substantially equal to (R1+R2)/R2.

11. The circuit of claim 11 wherein a fourth resistance R4 is connected between the collector of said transistor and a DC power supply voltage;

a fifth resistance R5 is connected between the emitter of said transistor and an AC ground; and a sixth resistance R6 is connected between said fifth resistance and a DC ground;

wherein the AC gain associated with said transistor is R4/R5; and the DC gain associated with said transistor is R4/(R5+R6).

12. An amplifier circuit for buffering an input signal comprising:

an input terminal to which the signal to be buffered is applied;

an input impedance matching network comprising the parallel combination of a capacitor and two series-connected resistors;

a signal processing network comprising a series connection of an operational amplifier and a common-emitter NPN transistor having a base, a collector, and an emitter, said signal processing network connected to said impedance matching network via a second capacitor; and a buffer stage connected to said signal processing network via an isolation resistor, said buffer stage including a transistor connected in a common collector configuration, a current biasing resistor, and a blocking capacitor;

wherein the power for said operational amplifier and said two transistors is supplied by a common DC source;

wherein said operational amplifier is biased by means of two voltage-dividing bias resistors;

wherein said processing network contains a feedback loop connecting a collector of said NPN transistor to a noninverting input of said operational amplifier;

wherein the collector circuit of said NPN transistor contains a resistance used to impart AC and DC gain to said NPN transistor, and the emitter of said NPN transistor contains a capacitor, a first resistance used to impart AC and DC gain to said NPN transistor, and a second resistance used to impart DC gain but not AC gain to said NPN transistor;

wherein said feedback loop contains two voltage-dividing gain-setting resistors and an op-amp-protecting resistor;

wherein the AC gain of said signal processing network is substantially determined by the values of said two gain-setting resistors.

* * * * *

UNITED STATES PATENT AND TRADEMARK OFFICE
CERTIFICATE OF CORRECTION

PATENT NO. : 4,354,163
DATED : October 12, 1982
INVENTOR(S) : David S. Kato

It is certified that error appears in the above-identified patent and that said Letters Patent are hereby corrected as shown below:

In Col. 6, line 44, delete "gainis" and insert in place thereof --gain is--.

In Col. 7, line 10, delete "11" (second occurrence) and insert in place thereof --10--.

Signed and Sealed this

Fourteenth Day of December 1982

[SEAL]

Attest:

GERALD J. MOSSINGHOFF

Attesting Officer

Commissioner of Patents and Trademarks